(12) United States Patent
Dyer

(10) Patent No.: US 6,747,306 B1
(45) Date of Patent: Jun. 8, 2004

(54) VERTICAL GATE CONDUCTOR WITH BURIED CONTACT LAYER FOR INCREASED CONTACT LANDING AREA

(75) Inventor: Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 10/358,488

(22) Filed: Feb. 4, 2003

(51) Int. Cl.⁷ .................. H01L 27/108; H01L 29/76; H01L 29/94; H01L 31/119
(52) U.S. Cl. .................. 257/302; 257/301
(58) Field of Search .................. 257/301, 302, 257/303, 305

(56) References Cited

U.S. PATENT DOCUMENTS

| | | | |
|---|---|---|---|
| 4,689,871 A | 9/1987 | Malhi | 437/40 |
| 5,077,228 A | 12/1991 | Eklund et al. | 437/40 |
| 5,140,388 A | 8/1992 | Bartelink | 357/23.4 |
| 5,293,053 A | 3/1994 | Malhi et al. | 257/330 |
| 5,324,973 A | 6/1994 | Sivan | 257/330 |
| 5,482,883 A | 1/1996 | Rajeevakumar | 437/52 |
| 5,574,299 A | 11/1996 | Kim | 257/296 |
| 5,583,075 A | 12/1996 | Ohzu et al. | 437/203 |
| 5,740,068 A | 4/1998 | Kiebmann et al. | 364/489 |
| 6,037,202 A | 3/2000 | Witek | 438/212 |
| 6,096,596 A | 8/2000 | Gonzalez | 438/239 |
| 6,175,953 B1 | 1/2001 | Scepanovic et al. | 716/21 |
| 6,269,472 B1 | 7/2001 | Garza et al. | 716/21 |

FOREIGN PATENT DOCUMENTS

| | | |
|---|---|---|
| JP | 62118567 A2 | 5/1987 |
| JP | 3133173 A2 | 6/1991 |

*Primary Examiner*—Ngân V. Ngô
(74) *Attorney, Agent, or Firm*—Steven Capella; Cantor Colburn LLP

(57) ABSTRACT

An access transistor for a semiconductor device includes a gate disposed in an upper region of a deep trench formed within a substrate of the semiconductor device. A gate contact is formed atop the gate, the gate contact having a diameter less than that of the deep trench and the gate. A conductive layer surrounds the gate contact, the conductive layer being disposed over the deep trench and over an active area of the semiconductor device surrounding the deep trench. The conductive layer provides a effective contact landing area for a diffusion region formed in the active area, wherein the effective contact landing area further includes a region between the diffusion region and the gate contact.

14 Claims, 5 Drawing Sheets

VERTICAL GATE CONDUCTOR WITH BURIED CONTACT LAYER FOR INCREASED CONTACT LANDING AREA

BACKGROUND

The present invention relates generally to semiconductor memory fabrication and, more particularly, to a vertical gate conductor having a buried contact layer for increased contact landing area, particularly suited for dynamic random access memory (DRAM) cell applications.

A dynamic random access memory (DRAM) circuit generally includes an array of memory cells interconnected by rows and columns, which are known as wordlines (WLs) and bitlines (BLs), respectively. Reading data from or writing data to memory cells is achieved by activating selected wordlines and bitlines. Typically, a DRAM memory cell includes a MOSFET (metal oxide semiconductor field effect transistor) connected to a storage capacitor for storing a bit of information. The MOSFET (also referred to as an access transistor, since it provides access by the bitline to the storage capacitor) includes a gate, as well as diffusion regions which are referred to as either drain or source regions, depending on the operation of the transistor.

Trench capacitors are one type of storage capacitor commonly used in DRAM cells. Specifically, a trench capacitor is a three-dimensional structure formed by etching trenches of various dimensions into a silicon substrate. Trenches typically include N+ doped polysilicon as one plate or electrode of the capacitor (i.e., the storage node). The other plate of the capacitor is formed usually by diffusing N+ dopants out from a dopant source into a portion of the substrate surrounding the lower part of the trench (i.e., a buried plate). A node dielectric is also formed along the lower walls of the trench, between the storage node and the buried plate, thereby forming the storage capacitor.

In order to prevent carriers from traveling through the substrate between the adjacent devices, device isolation regions are formed between adjacent semiconductor devices. Generally, such device isolation regions take the form of thick oxide regions extending below the surface of the semiconductor substrate. A sharply defined trench is formed in the semiconductor substrate by, for example, anisotropic etching. The trench is then filled with oxide back to the surface of the substrate to provide a device isolation region. Trench isolation regions thus formed are called shallow trench isolation (STI) and have the advantages of providing device isolation regions across their entire lateral extent and of providing a more planar structure.

There are different types of MOSFET structures that have been used in conjunction with DRAM cells. For example, a planar MOSFET is a transistor wherein the channel region of the transistor is generally parallel to the primary surface of the substrate. However, as course of DRAM development continues to be driven by the need for smaller cell sizes, vertical MOSFETs have emerged as the device of choice is in scaling the array transistor. A vertical MOSFET is a device built along the walls of a trench (i.e., the upper portion of the deep trench that is also used to construct the storage capacitor), such that the channel region of the transistor is generally perpendicular to the primary surface of the substrate. Thus, vertical MOSFETs allow the bit densities needed for effective size reduction. However, since the use of vertical MOSFETs is not yet widespread, there are several processing difficulties that need to be addressed.

For example, in forming a contact from a bitline to the bitline diffusion of a cell through a conductive stud (e.g., polysilicon), care is taken align the stud over the active area (AA) landing area, but also to do so without shorting the stud with the gate contact (i.e., avoiding wordline to bitline shorts). However, as the cell size and deep trench diameters continue to shrink, the critical overlay and critical dimension requirements of photolithographic patterning result in less margin for error in landing the bitline contacts. Accordingly, it would be desirable to be able to increase the effecting landing area for borderless bitline contacts in a manner that easily integrates with existing gate top engineering and top oxide methods.

SUMMARY

The foregoing discussed drawbacks and deficiencies of the prior art are overcome or alleviated by an access transistor for a semiconductor device. In an exemplary embodiment, the transistor includes a gate disposed in an upper region of a deep trench formed within a substrate of the semiconductor device. A gate contact is formed atop the gate, the gate contact having a diameter less than that of the deep trench and the gate. A conductive layer surrounds the gate contact, the conductive layer being disposed over the deep trench and over an active area of the semiconductor device surrounding the deep trench. The conductive layer provides a effective contact landing area for a diffusion region formed in the active area, wherein the effective contact landing area further includes a region between the diffusion region and the gate contact.

In another aspect, a memory cell for a dynamic random access memory (DRAM) array includes a storage capacitor formed within a lower region of a deep trench, and a vertical access transistor coupled with the storage capacitor. The vertical access transistor further includes a gate disposed in an upper region of the deep trench, a gate contact formed atop the gate, the gate contact having a diameter less than that of the deep trench and the gate, and a conductive layer surrounding the gate contact. The conductive layer is disposed over the deep trench and over an active area of the semiconductor device surrounding the deep trench, wherein the conductive layer provides a effective contact landing area for a bitline diffusion formed in said active area. The effective contact landing area further includes a region between the bitline diffusion and the gate contact.

BRIEF DESCRIPTION OF THE DRAWINGS

Referring to the exemplary drawings wherein like elements are numbered alike in the several Figures.

DETAILED DESCRIPTION

Figure 1:
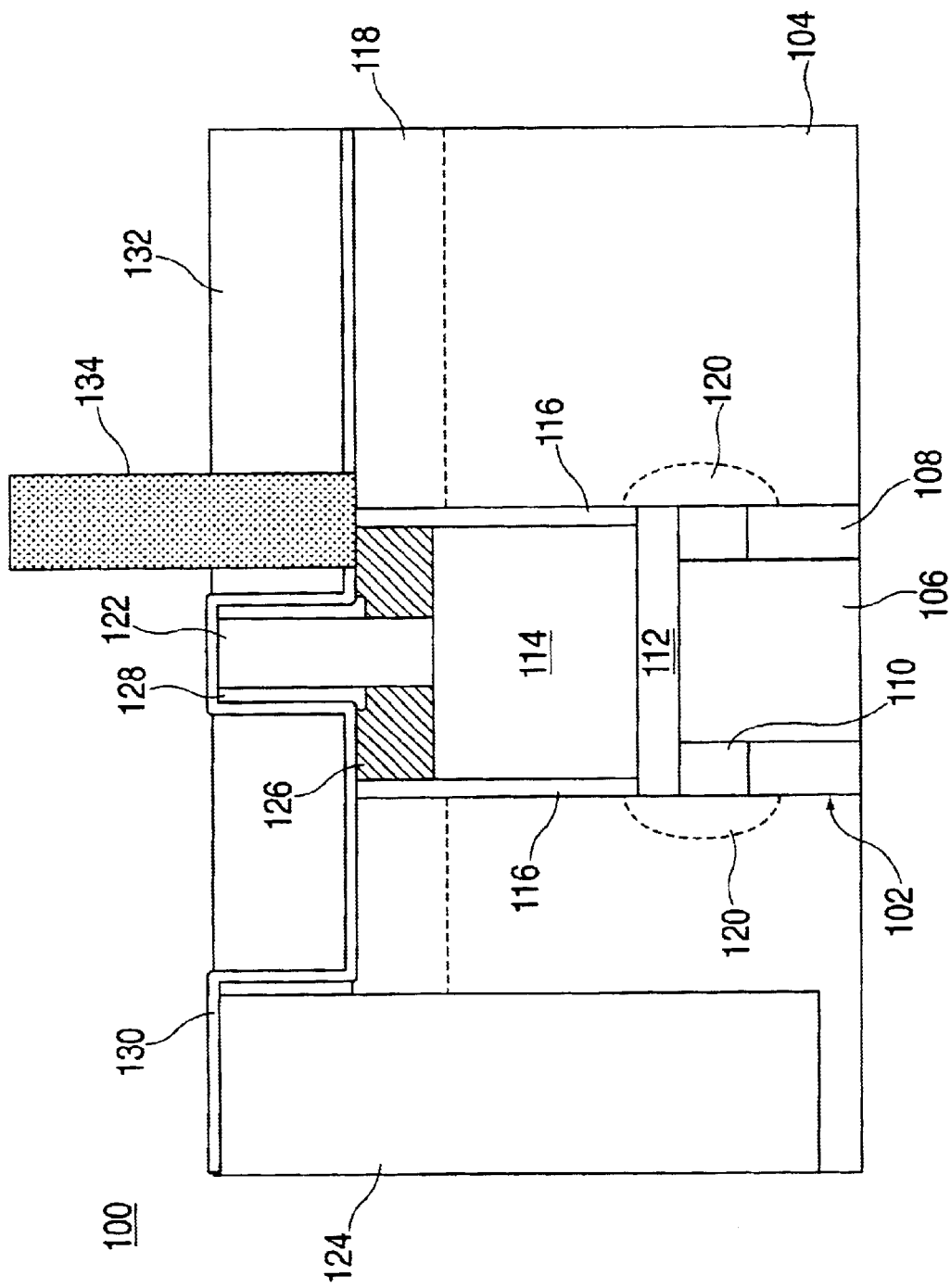
FIG. 1 is a cross-sectional view of a DRAM storage cell employing a vertical MOSFET access transistor, wherein the transistor has a reduced diameter gate conductor with respect to the deep trench.

Referring initially to FIG. 1, a cross-sectional view of a DRAM storage cell 100 employing a vertical MOSFET access transistor is illustrated. The storage cell includes a deep trench 102 formed within a silicon substrate 104. Those skilled in the art will recognize that, with regard to the deep trench 102, FIG. 1 depicts only the uppermost portion thereof, and thus the entire storage capacitor structure for the cell is not depicted (i.e., the node dielectric and buried plate region). However, for illustrative purposes, FIG. 1 does show the upper portion of the storage capacitor, particularly the cell node electrode 106 which is surrounded by an oxide collar 108 and a buried strap 110 atop the collar oxide 108. Formed atop the conductive buried strap 110 is a trench top oxide (TTO) 112 that electrically isolates the polysilicon gate 114 of the vertical transistor from the cell node 106. The poly-gate 114 is further surrounded by a relatively thin gate dielectric 116 (e.g., an oxide) that is formed upon the vertical sidewalls of the trench 102 and above the trench top oxide 112. In addition, those skilled in the art will also recognize the diffusion regions of the vertical transistor, namely the bitline diffusion 118 and the node or strap diffusion 120.

With a conventional DRAM transistor, a gate contact for contacting a wordline to the poly-gate has a diameter roughly corresponding to the diameter of the poly-gate 114. However, by forming a gate contact having a reduced diameter with respect to the poly-gate, the bitline contact area is increased. Thus, as is further shown in FIG. 1, a gate contact 122 is formed atop the poly-gate 114. Prior thereto, the vertical gate poly fill material is recessed from the top of the trench 102 so that nitride spacers (not shown) are deposited and etched. This prepares a narrower opening atop the recessed poly-gate material so that the reduced diameter gate contact material may deposited therein.

A pad nitride strip (following the formation of isolation trenches, e.g., trench 124) will then remove the spacer material, thereby leaving a divot surrounding the gate contact 122 and above poly-gate 114. This divot is then filled with a spacer material 126, such as silicon nitride (SiN), to insulate the poly-gate 114 and restore planarity to the top of the deep trench 102. Subsequently, the gate contact 122 is provided with a nitride spacer 128 vertically disposed thereon, before a nitride liner 130 is conformally deposited in preparation of the top oxide material 132. The nitride liner 132 serves as an oxide etch stop during formation of the vias for the bitline contact studs. By way of example, FIG. 1 further shows the formation of a bitline contact 134. As will be noted, the bitline contact 134 is slightly misaligned with respect to the bitline diffusion 118, in that it partially overlaps over the deep trench 102. Because of the reduced diameter of the gate contact 122, however, the misaligned bitline contact 134 is not shorted thereto. On the other hand, the fact that the bitline contact 134 only partially contacts bitline diffusion 118 results in an increased contact resistance and thus poorer device performance.

Figure 2:
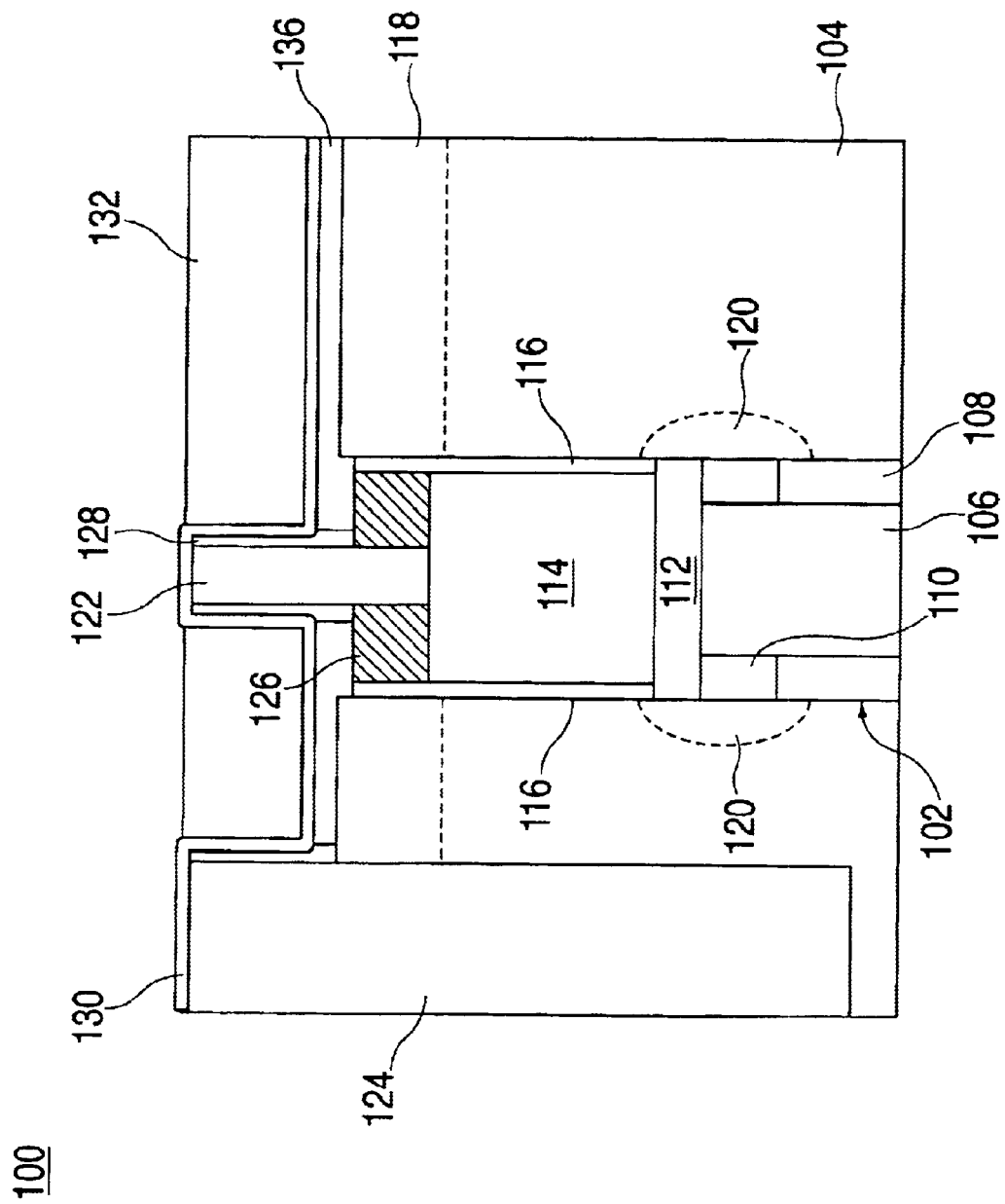
FIGS. 2 and 3 illustrate a cross-sectional view of the DRAM storage cell of FIG. 1, further including a buried contact layer between the active silicon surface and the top oxide layer, in accordance with an embodiment of the invention.

Therefore, in accordance with an embodiment of the invention, there is disclosed a vertical gate conductor for a DRAM cell that includes a buried contact layer for providing increased contact landing area. Thereby, the effective area for landing contacts to the active silicon in the vicinity of the vertical gate conductors is increased. Referring now to FIG. 2, there is shown a cross-sectional view of the DRAM storage cell of FIG. 1, further including a buried contact layer 136 disposed between the active silicon surface and the top oxide layer 132. The buried contact layer 136 is a conductive layer, such as polysilicon or other suitable conductive material, which surrounds the reduced diameter, vertical gate contact 122 and associated gate contact spacer 128. Because the buried contact layer also overlaps the wider, divot-filling spacer material 126, a robust connection is ensured, even if the bitline contact is partially aligned over the spacer material 126.

Figure 3:
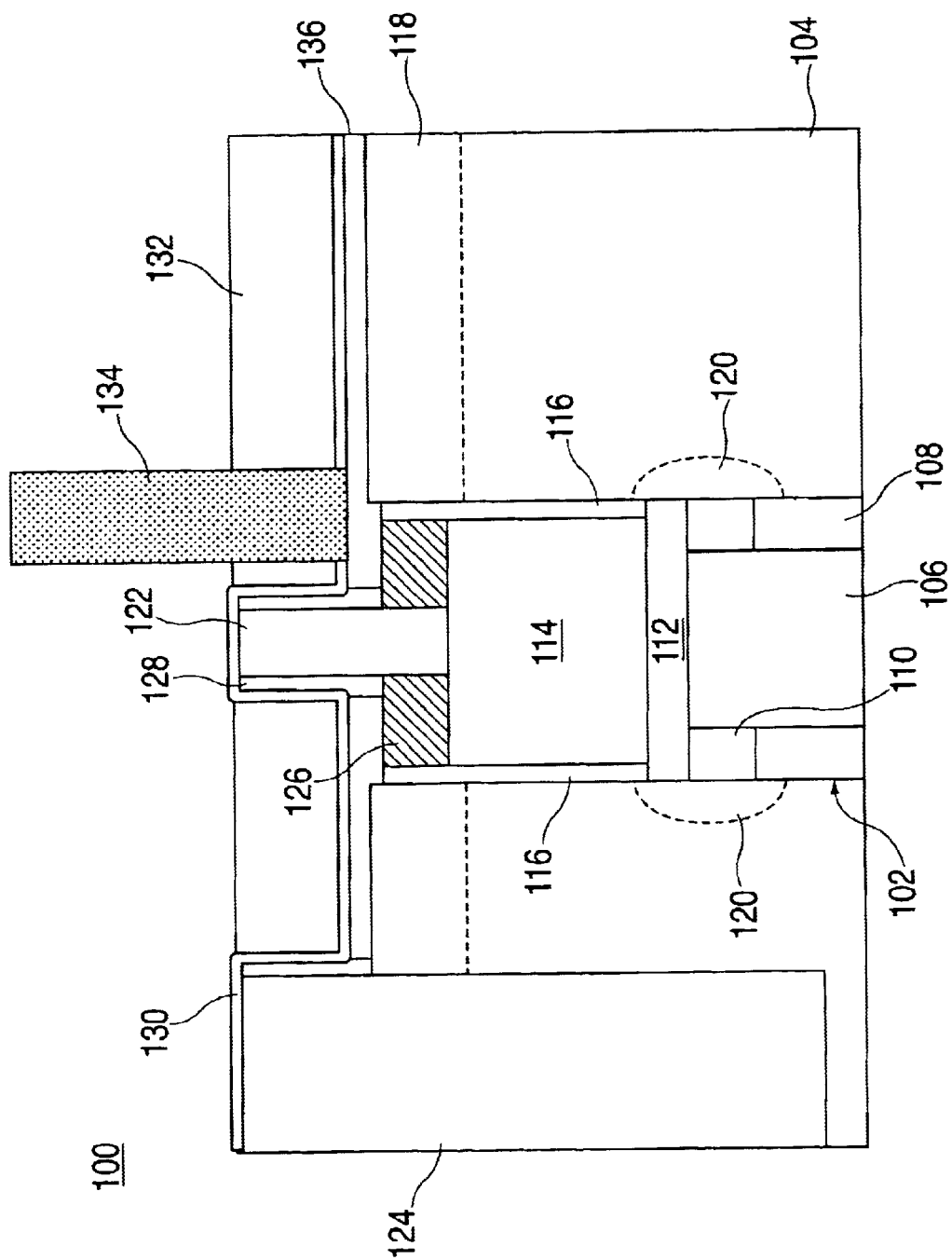

FIG. 3 illustrates the formation of the bitline contact 134 at the same location with respect to the gate contact 128 as is shown in FIG. 1. However, due to the presence of the buried contact layer 136 (in overlapping the spacer material 126), the storage cell 100 provides an increased landing area, as well as good bitline contact with the bitline diffusion 118. Again, the reduced diameter gate contact 128 provides additional landing room so as to avoid a bitline to wordline short.

Figure 4:
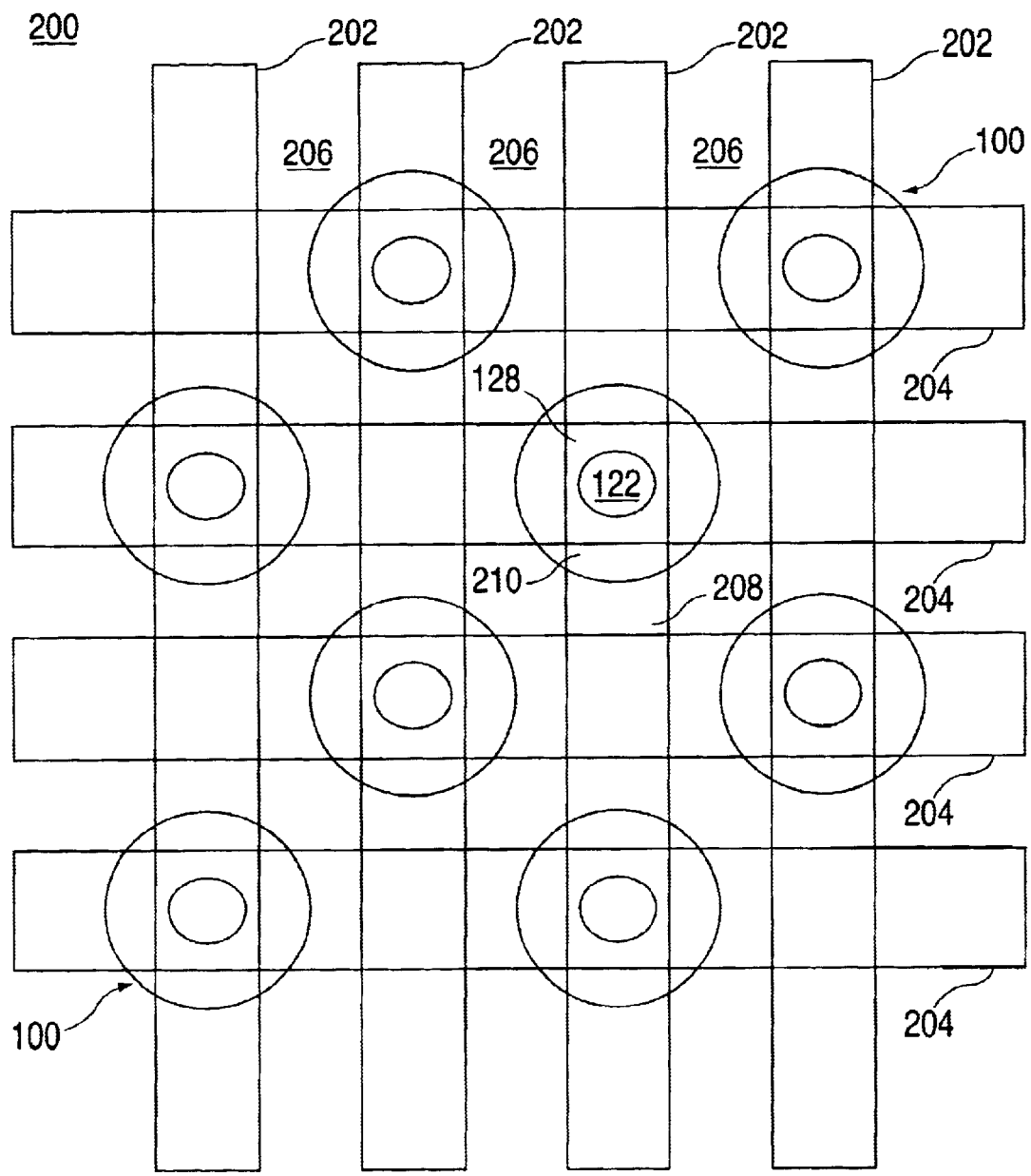
FIG. 4 is a top down view of an exemplary DRAM array having cells configured in accordance with the embodiment of FIG. 2, particularly illustrating the increased effective contact landing area produced thereby.

Referring to FIG. 4, there is shown a schematical top down view of an exemplary DRAM array 200 having individual cells 100 configured in accordance with the embodiment of FIG. 2. Each cell 100 is defined at the intersection between columns of active areas 202 (wherein the bitline diffusions are formed) and rows of wordlines 204 (which contact the gate contacts of the cells). Isolation trenches 206 are used to separate the active areas 202 from adjacent columns. As can be seen, the diameter of the gate contacts 122 are smaller than that of the deep trenches 102. In a conventionally configured cell (where the diameter of the gate contact is roughly equivalent to that of the deep trench), the effective landing area for a bitline contact would be defined by region 208; i.e., the portion of the active area between the deep trench and the next adjacent wordline. With the present configuration, the effective landing area is increased to include region 210, the area between the gate contact spacer 128 and the outer diameter of the deep trench 102. Thus, not only is the effective landing area increased, but the increased landing area also provide a conductive path for a bitline contact to the bitline diffusion.

The DRAM cell configuration described herein is easily integrated with existing DRAM processing techniques. The additional steps associated with forming the buried contact layer 136 may be added after a pad nitride stripping step and deep trench spacer formation, wherein the silicon nitride plug 126 is formed around the top part of the gate conductor 114 in the trench recess. At this point, the thin insulating (e.g., nitride) spacer 128 would to be applied to the vertical gate extensions (i.e., gate contacts 122) that stick out of the surface. This spacer 128 insulates the gate conductor from the subsequently formed conducting contact layer 136. Next, the pad oxide would be stripped away and a very thin nitridation (e.g., 5–10 Å) could be applied to the exposed silicon if needed. Then, the conducting layer 136 (e.g., polysilicon, silicide, metal, etc.) would be deposited.

Figure 5:
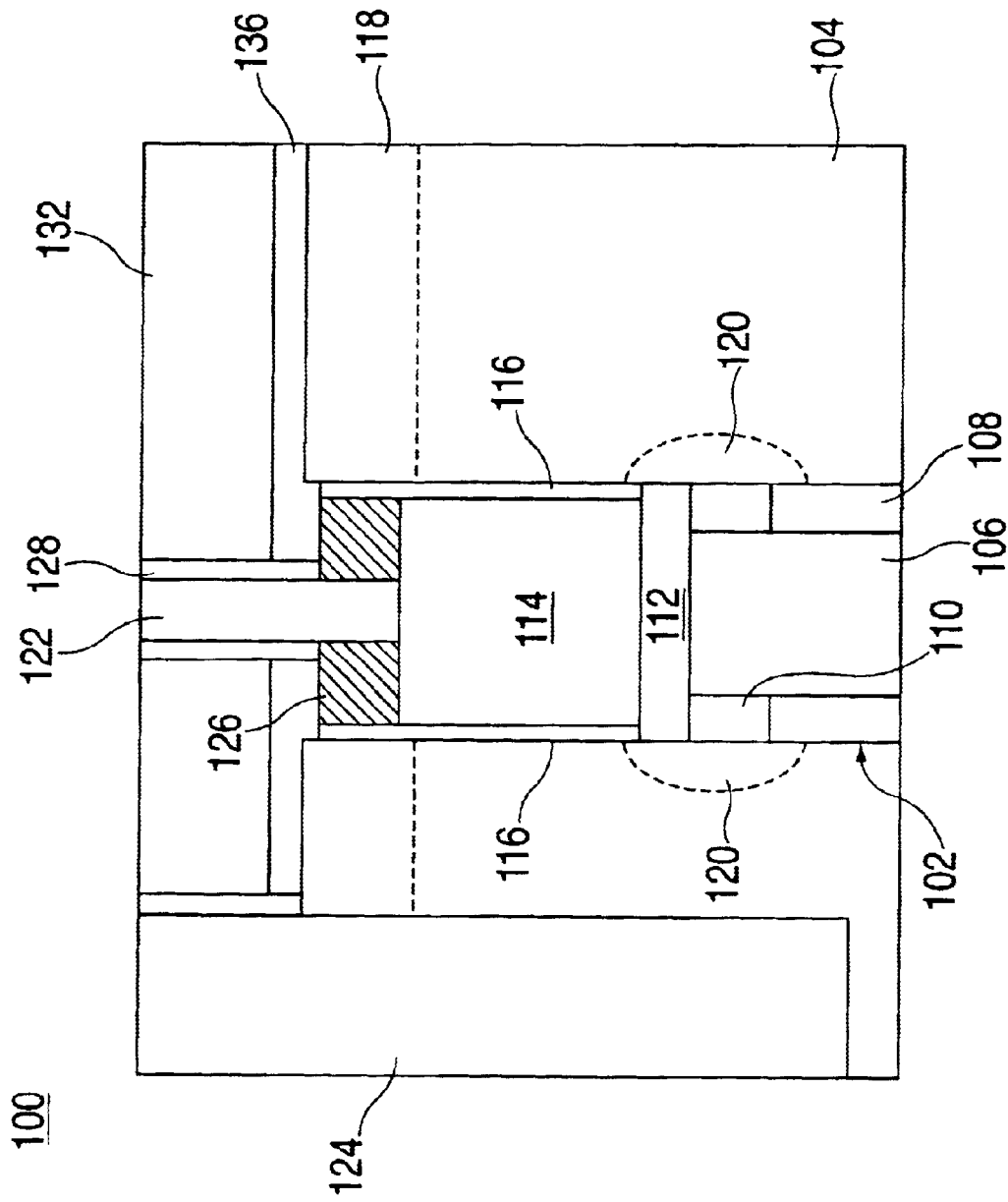
FIG. 5 is cross-sectional view of an alternative embodiment of the DRAM storage cell of FIG. 2.

In order to adhere the conductive contact layer to the horizontal surfaces only, a directional sputter deposition might be used. Alternatively, a combination of a conformal layer deposition, followed by a vertical ion implantation and selective etchback of the un-implanted material on the sidewalls could also be implemented. Once the spacer and the conducting layer are formed, the top oxide process may proceed as is known in the art, with a top oxide chemical mechanical polishing (CMP) planarization step to remove the top oxide over the isolation. This would allow the conducting layer to be removed from the raised isolation trench surface, regardless of whether the nitride liner 130 is present under the top oxide 132. (As an alternative embodiment, FIG. 5 illustrates the cell 100 without a nitride liner underneath the top oxide 132.) Later, when the top oxide is stripped away in the support area of the device, the conducting layer deposited in the support area would also be stripped away selective to the active silicon (assuming the conducting layer comprises a material which could be etched selective to the active silicon), or to the nitrided interface if one is used.

Still a further variation would be to recess the isolation trenches 124 following the pad nitride strip, such that the deposited conducting layer 136 encroaches to some degree into the IT areas as well. This could provide even greater effective landing area coverage.

As will be appreciated, the above described configuration directly alleviates the critical overlay and dimension requirements for the gate contact and deep trench. In addition, this configuration also "decouples" the size of the gate contact from the size of the deep trench, thus alleviating deep trench RIE, collar formation, trench conductor fill, and vertical device formation constraints by allowing larger trench diameters without the usual integration restrictions associated with gate contact and bitline contact formation.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An access transistor for a semiconductor device, comprising:
   a gate disposed in an upper region of a deep trench, said deep trench formed within a substrate of the semiconductor device;
   a gate contact formed atop said gate, said gate contact having a diameter less than that of said deep trench and said gate; and
   a conductive layer surrounding said gate contact, said conductive layer disposed over said deep trench and over an active area of the semiconductor device surrounding said deep trench;
   wherein said conductive layer provides a effective contact landing area for a diffusion region formed in said active area, said effective contact landing area further including a region between said diffusion region and said gate contact.

2. The access transistor of claim 1, further comprising a spacer material surrounding said gate contact, said spacer material disposed within said deep trench between said gate and said conductive layer.

3. The access transistor of claim 2, further comprising a gate contact spacer vertically disposed on said gate contact, wherein said conductive layer surrounds said gate contact spacer.

4. The access transistor of claim 2, wherein said spacer material further comprises a silicon nitride plug disposed at the top of said deep trench.

5. The access transistor of claim 4, further comprising a gate dielectric, said gate dielectric formed along vertical side walls at the top of said deep trench, said gate dielectric further surrounding said gate and said spacer material.

6. The access transistor of claim 2, further comprising:
   a nitride liner formed over said conductive layer; and
   an top oxide formed over said nitride liner.

7. The access transistor of claim 2, wherein said conductive layer comprises polysilicon.

8. A memory cell for a dynamic random access memory (DRAM) array, compromising:
   a storage capacitor formed within a lower region of a deep trench; and
   a vertical access transistor coupled with said storage capacitor, said vertical access transistor further comprising:
   a gate disposed in an upper region of said deep trench;
   a gate contact formed atop said gate, said gate contact having a diameter less than that of said deep trench and said gate; and
   a conductive layer surrounding said gate contact, said conductive layer disposed over said deep trench and over an active area of the semiconductor device surrounding said deep trench;
   wherein said conductive layer provides a effective contact landing area for a bitline diffusion formed in said active area, said effective contact landing area further including a region between said bitline diffusion and said gate contact.

9. The memory cell of claim 8, further comprising a spacer material surrounding said gate contact, said spacer material disposed within said deep trench between said gate and said conductive layer.

10. The memory cell of claim 9, further comprising a gate contact spacer vertically disposed on said gate contact, wherein said conductive layer surrounds said gate contact spacer.

11. The memory cell of claim 9, wherein said spacer material further comprises a silicon nitride plug disposed at the top of said deep trench.

12. The access transistor of claim 11, further comprising a gate dielectric, said gate dielectric formed along vertical side walls at the top of said deep trench, said gate dielectric further surrounding said gate and said spacer material.

13. The access transistor of claim 9, further comprising:
   a nitride liner formed over said conductive layer; and
   an top oxide formed over said nitride liner.

14. The access transistor of claim 9, wherein said conductive layer comprises polysilicon.

* * * * *